United States Patent [19]

Radziun et al.

[11] Patent Number: 5,131,284
[45] Date of Patent: Jul. 21, 1992

[54] DISPLACEMENT PROBE FOR CRYOGENIC MAGNET

[75] Inventors: Michael J. Radziun, South Milwaukee; Scott T. Mansell, Waterford, both of Wis.

[73] Assignee: General Electric Company, Milwaukee, Wis.

[21] Appl. No.: 516,886

[22] Filed: Apr. 30, 1990

[51] Int. Cl.$^5$ ............................................. G01D 21/00
[52] U.S. Cl. ................................................... 73/866.5
[58] Field of Search ................ 73/766, 767, 774, 775, 73/781, 786, 866.5, 862.65–862.67, 866.5; 33/783, 788, DIG. 13; 324/318–320

[56] References Cited

U.S. PATENT DOCUMENTS

| | | | |
|---|---|---|---|
| 2,414,161 | 1/1947 | Moore | 73/767 |
| 3,064,221 | 11/1962 | King | 73/862.67 |
| 3,240,055 | 3/1966 | Eddens | 73/862.65 |
| 4,721,934 | 1/1988 | Stacy. | |

OTHER PUBLICATIONS

Catalogue page, "Strain Gages for Use in Intense Magnetic Field Environments" p. 73.
Measurement Systems, Application and Design, Ernest O. Doebelin, pp. 231–233.

Primary Examiner—Robert Raevis
Attorney, Agent, or Firm—Quarles & Brady

[57] ABSTRACT

A probe for measuring the displacement between the outer supporting wall of a cryostat and the inner magnet coil form employs magnetically balanced strain gauges attached to a beam with one end fixed to the cryostat wall and the other end held by the magnet coil form. The magnetically balanced strain gauges comprise two superimposed strain gauges with countervailing current flow. In one embodiment, two sets of gauges are attached in conventional bridge arrangement to provide temperature compensation.

4 Claims, 2 Drawing Sheets

DISPLACEMENT PROBE FOR CRYOGENIC MAGNET

BACKGROUND OF THE INVENTION

This invention relates to electro-mechanical measuring apparatus for use with high field strength superconducting magnets and in particular to a probe for measuring relative displacement between the magnet coils and the outer mounting surfaces of the cryostat of a high field strength superconducting magnet.

Superconducting magnets find commercial use in magnetic resonance imaging (MRI). In MRI, the protons of an imaged body are excited into resonance by a radio frequency field applied to the imaged object in the presence of a static magnetic field. The static magnetic field may be produced by a superconducting magnet having multiple coils of superconducting wire immersed in a cryogen and energized with an electrical current. Field strengths of several Tesla may be achieved with essentially no power consumption.

The frequency of the resonance of the protons of the imaged object excited by the radio frequency field is dependant on the strength of the magnetic field and certain characteristics of the protons.

As the protons precess in resonance, separate gradient magnetic fields of substantially smaller strength than the static magnetic field are applied to the imaged body to shift the phase and frequency of the resonance of the protons in accordance with each proton's location within the imaged object. The combined signal produced by the resonating protons is then analyzed mathematically to produce an image of the imaged body along a "slice" through the imaged body.

The contribution of each resonating proton to the slice image is dependant of the phase and frequency of its resonance. If the static magnetic field is uniform, this phase and frequency will be dependent solely on the position of the protons in the gradient magnetic field. If the static magnetic field is not uniform, the apparent position of the protons, as determined by the phase and frequency of their resonance, will be shifted. This introduces artifacts or other distortions into the reconstructed image of the imaged body. The elimination of such artifacts requires that the static magnetic field used in MRI must be extremely uniform. Magnetic field homogeneities of less than a few parts per million over the imaging volume are required.

It follows that the static magnetic field also must be highly stabile. The time required to collect the data for a single MRI slice image may be several minutes for certain imaging techniques. Accordingly, fluctuations of the static magnetic field in time will also introduce artifacts and distortions to the image.

One cause of instabilities in the static magnetic field is mechanical motion of the superconducting magnet coils within the magnet support structure or cryostat.

Motion of the magnet coils is a particular problem for MRI equipment used in mobile applications. This MRI equipment is attached to a mobile trailer rather than to the foundation of a building and hence is subjected to considerably more environmental vibration.

The coils of the superconducting magnet are immersed in a cryogen, typically liquid helium and held fixed within a helium vessel. The cryogen is at temperatures near 4° K. and must be insulated from the ambient temperatures of approximately 300° K. This is accomplished by a vacuum shell and a series of heat shields forming a cryostat that surrounds the helium vessel to reduce heat flow inward to the helium vessel.

The helium vessel may be suspended within the cryostat by a series of tensioned supports attached to the outer shell of the cryostat. These supports provide a path for heat flow between the outer wall of the cryostat and the helium vessel and hence are insulated and minimized in number. Generally, in determining the number and size of the supports, there is a tradeoff between designing the support system to hold the helium vessel rigidly with respect to the outer shell of the cryostat and designing the support system to reduce the amount of heat leakage along the supports to the helium vessel. In mobile applications, there is a tradeoff between designing the support system to hold the helium vessel rigidly with respect to the outer shell of the cryostat and designing the support system to resist the shock of travel. The ability to accurately measure the vibrational susceptibility of a magnet coil support system would be valuable in making these tradeoffs.

Measuring a high field superconducting magnet's resistance to vibration is difficult. As mentioned, the helium vessel is surrounding by radiation shields and held within a vacuum at superconducting temperatures. For a 1.5 Tesla magnet, the magnetic field strength within the magnet may be as high as 4.5 Tesla or over 500,000 times the strength of the earth's magnetic field. In short, the helium vessel is not readily accessible to conventional measuring instruments.

SUMMARY OF THE INVENTION

The invention provides a probe for measuring extremely small motions of the magnet coils with respect to the outer shell of the cryostat. Specifically, the probe includes an elongate beam having one end adapted to be received by a part of the magnet coils. A clamp fixes the other end of the beam to the supporting shell of the magnet. Relative movement of the magnet coils and the supporting shell is detected by strain gauge array attached to the side of the beam to measure longitudinal strain of the beam. The strain gauge array is composed of two coextensive strain gauges with countervailing current flows.

It is one object of the invention, therefore, to provide a means of measuring movement of the magnet coils with respect to the outer magnets supporting shell that is unaffected by the hostile physical conditions present in the immediate environment of the magnet. The simple bending beam design permits operation in the cryogenic temperature ranges and the use of strain gauge arrays with countervailing current flows permits operation within the extremely high magnetic fields of the magnet.

In one embodiment, two strain gauge arrays are attached to opposing sides of the beam and connected in a bridge with external resistors. Further, the beam may be hollow permitting the passage of gaseous cryogen and reducing the beam's stiffness to increase the probe's sensitivity to motion.

It is thus another object of the invention to provide a displacement probe that may be readily inserted and removed from an operating superconducting magnet. The opposed strain gauge arrays provide temperature compensation that permits accurate strain measurement in a broad range of temperatures during the cooling of the probe after insertion. The hollow beam permits the release of gaseous cryogen from inside the magnet generated by the introduction of the warm probe to the magnet, and speeds the temperature equalization of the probe.

In one embodiment, the beam is attached to the magnet's ramping port and electrical ramping plug used ordinarily for energizing the magnet with electricity.

It is yet another object of the invention, therefore, to permit measuring magnet coil motion with respect to the magnet shell without the need for special modifications to the magnet.

the magnet coil supporting structure of a magnet may be evaluated by subjecting the supporting frame of the magnet to broad band vibration and recording the spectra of the broad band vibration. The displacement probe may be used to measure the relative motion of the magnet coil with respect to the supporting frame. The spectrum of the magnet coil motion maybe compared to spectrum of the broad band vibration to determine the resistance of the magnet to vibration.

It is a further object of the invention to provide a method of evaluating the mechanical properties of magnets and therefore to permit the design of improved magnet support structures.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference is made therefore to the claims wherein for interpreting the scope of the invention.

DESCRIPTION OF THE PREFERRED EMBODIMENT

Figure 1:
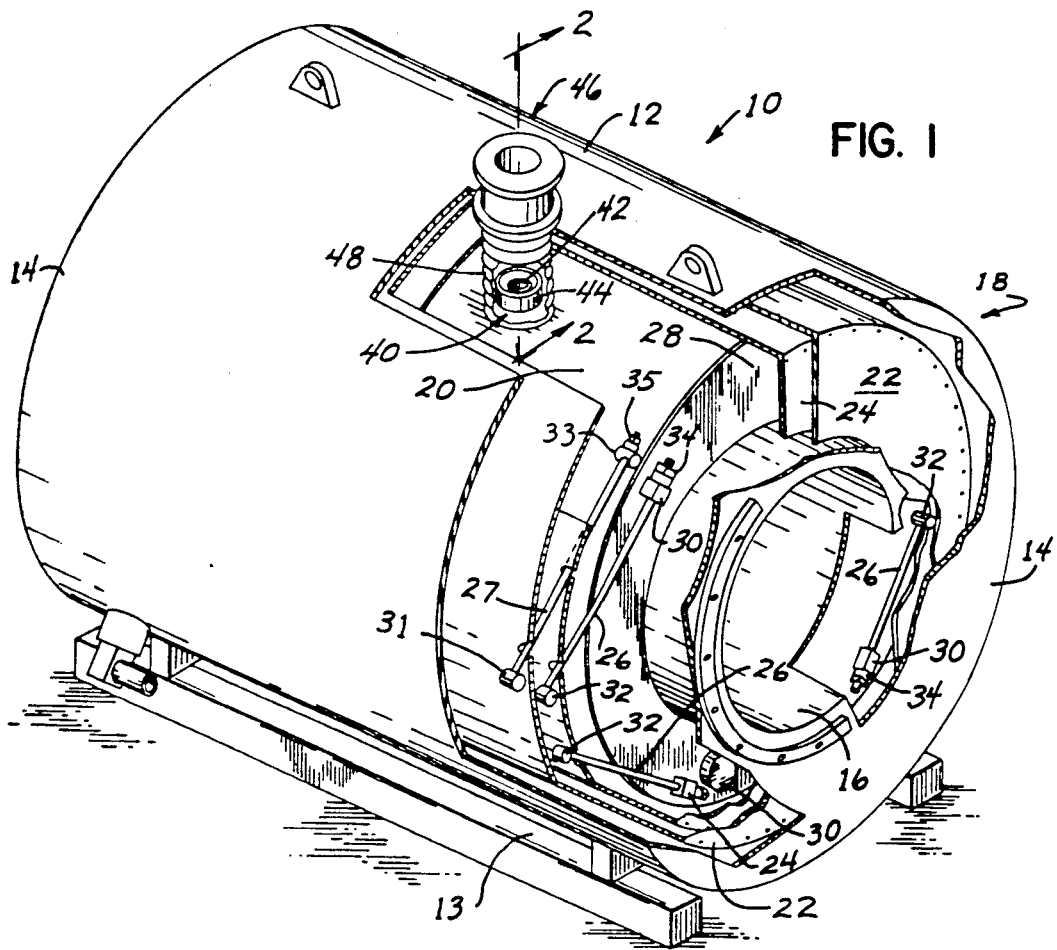
FIG. 1 is a perspective view of a high field strength superconducting magnet suitable for use with the present invention and having portions cut away to show the supports holding the helium vessel and to show the ramping port.

Referring to FIG. 1, a superconducting magnet 10 suitable for use with the present invention is contained within a generally cylindrical cryostat outer wall 12 constructed of rolled steel plate to provide vacuum containment. Support flanges 13 are attached to the cryostat outer wall 12 for supporting the magnet 10.

The cryostat outer wall 12 is closed at either end by disk shaped endplates 14 having centered circular openings to provide access to a bore tube 16 of smaller radius than the cryostat outer wall 12 and centered lengthwise within the cryostat outer wall 12 and coaxial with the cryostat outer wall 12. The bore tube 16 permits access by the patient to the magnet 10. Together, the cryostat outer wall 12, the endplates and bore tube create a sealed cryostat shell 18 which provides a support structure for the magnet 10.

Centered within the cryostat shell 18 is a similarly shaped helium vessel 20 partially filled with liquid helium and containing a series of magnet coils on a coil form (not shown). The magnet coils are rigidly attached to the helium vessel 20 through the coil form and hence the vibration of the magnet coils may be considered identical to the vibration of the helium vessel 20. Between the helium vessel 20 and the cryostat shell 18 are two radiation shields: an 80° K. shield 22 and a 20° K. shield 24 shaped similarly to the cryostat shell 18 and fitting coaxially within the cryostat shell 18. The shields 22 and 24 are disposed so that the helium vessel 20 is nested within the closed surface of the 20° K. shield 24, the 20° K. shield 24 is held within the closed surface of the 80° K. shield 22, and the 80° K. shield 22 is held within the cryostat shell 18.

The helium vessel 20 is supported by the cryostat shell 18 through the agency of eight inner radial stainless steel supports 26 (only three are shown in FIG. 1) and eight outer radial stainless steel supports 27 (only one is shown in FIG. 1). These sixteen radial supports 26 and 27 are at either end of the helium vessel 20 and lie in approximately the same plane and parallel to the endplates 28 of the helium vessel 20. The supports 26 and 27 are located symmetrically about the midplane of the cryostat shell 18. Each inner support 26 is attached to the helium vessel 20 by means of a block 30 rigidly fixed to the endplate 28 of the helium vessel 20. The other end of the support 26 is attached along the inner surface of the endplate 24 of the 80° K. shield by a pin 32.

Each outer support 27 is also attached along the inner surface of endplate 24 of the 80° K. shield by a pin 33. A hole in the pin 33 receives a threaded end of support 27 and is held by a nut 35. The support 27 then passes through a hole in the cylindrical outer wall of the 80° k. shield to the inner surface of the outer cryostat wall 18 where it is secured to the end flange (not shown) by means of a pin 31. The inner and outer straps 26 and 27 thus serve to suspend the helium vessel 20 within the cryostat shell 18 and to prevent direct heat flow along the straps 26 and 27 from the cryostat outer wall 12 to the helium vessel 20.

Adjustment of the nuts 34 and 35 permit the tension of the supports 26 and 27 to be adjusted to align the helium vessel 20 within the cryostat shell 18 and to reduce relative motion between the two.

Similar but smaller diameter supports (not shown) are used to prevent axial motion of the helium vessel 20 with respect to the cryostat shell 18.

A detailed description of a second cryogenic magnet 10 also suitable for use with the present invention is contained in Stacy U.S. Pat. No. 4,721,934, issued on Jan. 1988, assigned to the same inventor as the present invention, and hereby incorporated by reference.

The ends of the magnet coils (not shown) within the helium vessel 20 are connected to a ramping plug 40 extending through the upper surface of the helium vessel 20 and affixed rigidly thereto, and hence rigidly linked to the magnet coils, and composed of an inner and outer coaxial tubular conductors 42 and 44 respectively. Electrical current is supplied to the magnet coils through the ramping plug 40 by means of a external power supply (now shown) and once the correct magnetic field strength has been reached the power supply is disconnected. This process is termed "ramping" in reference to the gradual introduction of current to the magnet coils.

A ramping port 46 on the upper surface of the cryostat outer wall 12 provides access to the ramping plug 40 through a flexible stainless steel bellows 48 held between the inner surface of the cryostat outer wall 12 and the outer surface of the helium vessel 20. The bellows 48 maintain the integrity of a vacuum held in the space between the helium vessel 20 and the cryostat shell 18. The bellows 48 pierces the 20° K. and 80° K. shields 24 and 22 to provide the access to the ramping plug 40 as described above.

Figure 2:
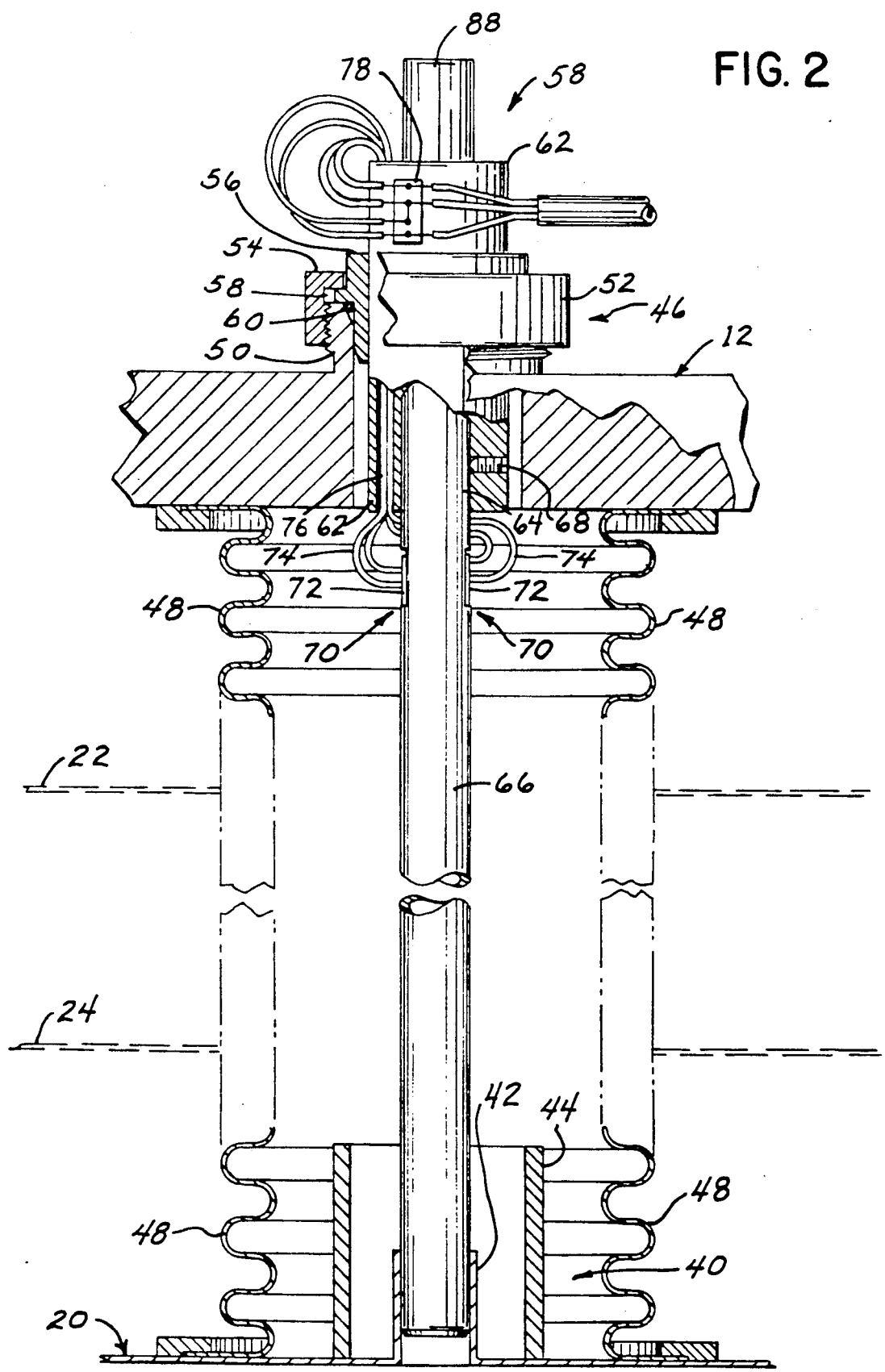
FIG. 2 is a cross-sectional view of the ramping port of the magnet of FIG. 1 with portions cutaway for clarity; and showing the placement of the displacement probe of the present invention.

Referring to FIG. 2, the ramp port 46 is comprised of an externally threaded tubular flange 50 extending from the outer surface of the cryostat outer wall 12. The flange 50 receives an internally threaded aluminum retaining ring 52 having an upper lip 54 for capturing a connector or the like between the lower surface of the lip 54 and the upper surface of the flange 50.

A tubular brass sleeve 56 is held to the ramp port 46 by means of an alignment ridge 58 extending radially from the brass sleeve 56. The alignment ridge is captured between the lower surface of lip 54 of the retaining ring 52 and an o-ring 60 placed on the top surface of the threaded flange 50.

The brass sleeve 56 in turn holds a cylindrical stainless steel retainer 62 which is free to slide radially in and out of the cryostat shell 18 and to rotate within the brass sleeve 56 without interference from the ramp port 46. The stainless steel retainer 62 may be locked to the brass sleeve 56 by means of a series of set screws (not shown).

A radially extending hole 64 through the axis of the stainless steel retainer 62 receives a tubular phenolic beam 66. The beam 66 is also free to slide radially in and out of the cryostat shell 18 and to rotate within the stainless steel sleeve 62 but may be fixed in position by a second series of set screws 68 in the stainless steel sleeve 62.

The length of the beam 66 is such that it may be inserted into the cryostat shell 18 through the ramp port 46 to extend to the surface of the helium vessel 20. A first "bore end" of the beam 66 so inserted is of a radius such that approximately one inch of its length may be received by the inner coaxial conductor 42 of the ramping plug 40 while maintaining approximately 0.001 inches of clearance. The bore end of the beam 66 is chamfered to aid in this insertion process.

A pair of flat surfaces 70 are machined on opposing walls of the beam 66 just below the stainless steel retainer 62 but within the cryostat shell 18 when the beam 66 has been inserted into the ramping plug 40 as described. Magnetically compensated strain gauge arrays 72 are affixed by low temperature cement to the surfaces of these machined flats 70 so as to measure longitudinal strain in the beam 66. Strain gauge arrays 72 suitable for this application are constructed of a pair of strain gauges laminated together so as to be electrically insulated from one another but aligned with each other and essentially coextensive. The pair of gauges are connected in series so that current flowing though each portion of one gauge is matched by a countervailing current flowing through a corresponding portion of the other gauge. As will be appreciated by one of ordinary skill in the art, currents generated by motion of each gauge array 72 within the strong magnetic fields of the magnet 10 will thus cancel and not obscure the strain readings of the gauge arrays 72. Suitable gauges are the H-series gauges from Measurement Group of Raleigh, N.C. Such compensated strain gauges are known for use with fluctuating magnetic fields associated with AC motors and the like having much lower peak magnitudes than the static field found in the cryostat shell 18.

The alignment of the gauge arrays 72 with respect to the cryostat shell 18 is determined by a line 88 engraved in the upper end of the beam 66.

Figure 3:
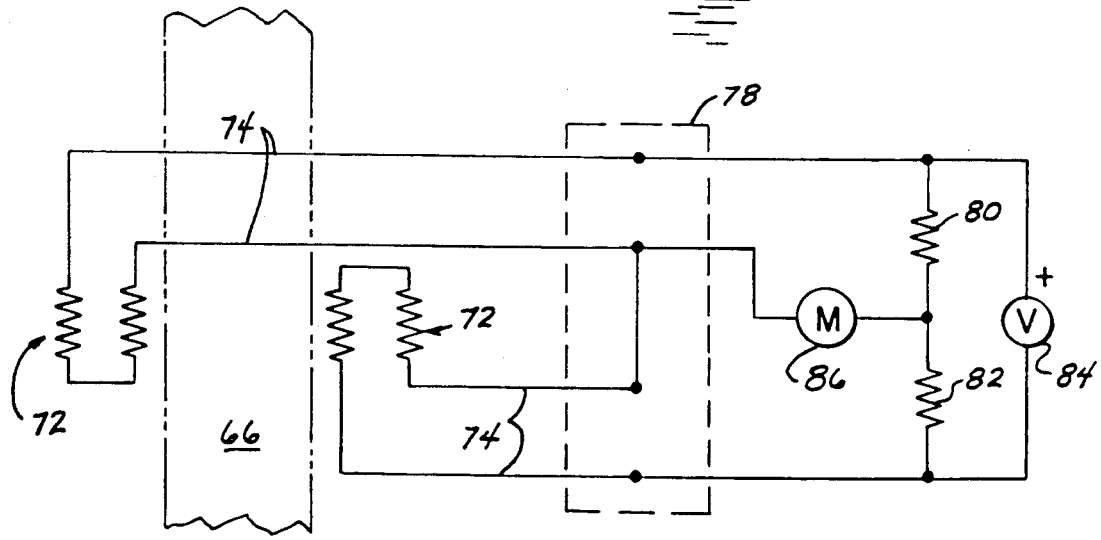
FIG. 3 is a schematic representation of the electrical connection of the strain gauge arrays of the displacement probe of FIG. 2 in a full bridge.

Referring to FIGS. 2 and 3, two leads 74 are connected to each strain gauge array 72 and passed through a channel 76 cut through the stainless steel adapter 62 to outside of the cryostat shell 18. A terminal strip 78 attached to the outside portion of the stainless steel adapter 62 is used to connect the strain gauge arrays 72 in a conventional full bending bridge configuration with bridge resistor 80 and 82 and voltage reference 84. Specifically one lead of one strain gauge array 72 is attached to the positive terminal of the voltage reference 84 and one lead of the other strain gauge array 72 is attached to the negative terminal of the voltage reference 84. The remaining leads of the strain gauge arrays 72 are connected together. The bridge resistors 80 and 82 are connected in series across the voltage reference 84. The voltage between the junction of the strain gauge arrays 72 and the junction of the bridge resistors 80 and 82 is measured by suitable instrumentation 86 as is known in the art. It will be appreciated that the use of two strain gauge arrays 72 on opposing sides of the beam 66 effectively doubles the sensitivity of the measurement of longitudinal bending of the phenolic beam 66 and provides temperature compensation for each strain gauge array 72. Provided that the temperature of the cryogenic atmosphere within the cryostat shell 18 affects each strain gauge array equally, the voltage at their junction in the bridge will not change.

The beam 66 is selected to have low thermal and electrical conductivity and low bending stiffness. The tubular shape of the beam increases the strain produced by the bending of the beam 66 and thus increases the sensitivity of the probe. The beam 66 is also tubular to permit the exhaust of gaseous cryogen generated by the introduction of the displacement probe and to help equalize the temperature of the beam during the cooling process. After the beam 66 is near the internal temperature of the magnet 10, the tubular opening within the beam 66 may be stopped by an elastic plug (not shown).

Use of the above described displacement probe requires that the length of the beam 66 first be adjusted to permit approximately one inch of the magnet end of the beam 66 to be received by the inner coaxial conductor 42 of the ramping plug 40. The set screws 68 are tightened to fix the brass sleeve 56, the stainless steel retainer 62 and the beam 66 together. The displacement probe is then removed and the scale factor of the gauge arrays 72 for that length of beam 66 is determined by bench measurements. Typical sensitivities obtainable with the displacement probe are on the order of 0.002 mm. The displacement probe is then reinserted into the ramp port 46 and the brass sleeve 56 clamped to the ramp port 46 by means of the retaining ring 52. Displacement measurement may then be made for motion along the axis defined by the two strain gauge arrays 72. For measurements along a different axis, the threaded ring 56 may be loosened and the brass sleeve 56 rotated to the orientation desired.

The internal support structure of cryogenic magnet 10 maybe evaluated by vibrating the cryostat shell 18. Preferably the vibration is broad band, that is, it includes a variety of vibration frequencies. The spectrum of the vibration is measured with an accelerometer (not shown) attached to the cryostat shell 18 and analyzed by a spectrum analyzer or digital Fourier transform techniques.

The displacement data from the displacement probe, taken simultaneously with the vibration data of the cryostat shell 18 is also analyzed to determined the vibration spectrum of the helium vessel 20 and the two spectra are compared. Similar peaks in both spectra indicate resonant modes of the helium vessel 20 and provide an aid to design of the magnet coil support structure or quality control of the manufactured magnets 10.

Alternatively, the variations in the static magnetic field with time may be determined by operating the MRI system in a small sample stability test. In this test, a small sample of a known material is placed within the bore of the magnet 10 and excited into resonance by the radio frequency generator of the MRI system (not shown). As noted above, the frequency of the resonance of the protons of the sample will depend on the strength of the static magnetic field and hence instability of the static magnetic field may be determined by measuring the frequency or phase shift to this resonance signal. The spectrum of the variation in the static magnetic field may be determined and compared to the spectrum produced from the displacement probe measurements. The displacement probe may thus be used to evaluate manufactured magnets 10 for static magnetic field instability based on a deduced relationship between motion of the helium vessel 20 and magnetic field instability.

A preferred embodiment of the invention has been described, but it should be apparent to those skilled in the art that many variations can be made without departing from the spirit of the invention. For example other low stiffness and insulating materials may be substituted for the phenolic material of the beam 66 and other materials may be readily substituted for the sleeve 56 and retainer 62. Also, it will be understood that the ends of the beam 66 may be readily adapted for use with magnets having slightly different mechanical arrangements including different styles of ramping plugs. In order to apprise the public of the various embodiments that may fall within the scope of the invention, the following claims are made.

We claim:

1. A displacement probe for use with an operating cryogenic magnet for measuring relative motion along a displacement axis between cryogenic magnet coils having a rigidly linked element and an outer supporting shell comprising:
   a beam having at least one longitudinally elongate side perpendicular to the displacement axis separating a first and second end, the second end adapted to be received by the element of the magnet coils;
   a clamping means for affixing the first end of the beam to the supporting shell; and
   a strain gauge array affixed to the side of the beam for measuring longitudinal strain of the beam to provide an indication of bending of the beam and hence displacement along the displacement axis, the array comprising two coextensive strain gauges supporting countervailing current flows.

2. The displacement probe of claim 1 wherein the beam is tubular for allowing the passage of escaping cryogen therethrough.

3. The displacement probe of claim 1 wherein the beam has a second longitudinally elongate side opposing the first side and including a second strain gauge array affixed to the second side in opposition to the first strain gauge array, the second strain gauge array also comprising two coextensive strain gauges supporting countervailing current flows.

4. A displacement probe for use with an operating cryogenic magnet having a ramping port to receive cryogen and to grant access to a ramping plug which receives electrical current during the starting of the magnet, the displacement probe measuring relative coils rigidly linked to the ramping plug and an outer supporting shell rigidly attached to the ramping port comprising:
   a beam having at least one longitudinally elongate side perpendicular to the displacement axis separating a first and second end, the second end adapted to be received by the ramping plug and the first end received through the ramping port;
   a clamping means for affixing the first end of the beam to the ramping port; and
   a strain gauge array affixed to the side of the beam for measuring longitudinal strain of the beam to provide an indication of bending of the beam and hence displacement along the displacement axis, the array comprising two coextensive strain gauges supporting countervailing current flow.

* * * * *

UNITED STATES PATENT AND TRADEMARK OFFICE
CERTIFICATE OF CORRECTION

PATENT NO. : 5,131,284

DATED : July 21, 1992

INVENTOR(S) : Radziun et al.

It is certified that error appears in the above-identified patent and that said Letters Patent is hereby corrected as shown below:

Col. 2, line 23,    "surrounding" should be --surrounded--.

Col. 3, line 32     "wherein" should be --herein--.

Col. 4, line 61     "(now shown)" should be --(not shown)--.

Signed and Sealed this

Tenth Day of August, 1993

Attest:

MICHAEL K. KIRK

*Attesting Officer*    *Acting Commissioner of Patents and Trademarks*